(12) United States Patent
Pyo et al.

(10) Patent No.: US 9,705,084 B2
(45) Date of Patent: Jul. 11, 2017

(54) ORGANIC LIGHT EMITTING DIODE DISPLAY AND MANUFACTURING METHOD THEREOF

(75) Inventors: Sang-Woo Pyo, Yongin (KR);
Seung-Mook Lee, Yongin (KR);
Byeong-Wook Yoo, Yongin (KR);
Hyo-Yeon Kim, Yongin (KR);
Myung-Jong Jung, Yongin (KR);
Jin-Woo Park, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 579 days.

(21) Appl. No.: 13/461,580

(22) Filed: May 1, 2012

(65) Prior Publication Data

US 2013/0043498 A1 Feb. 21, 2013

(30) Foreign Application Priority Data

Aug. 18, 2011 (KR) ........................ 10-2011-0082260

(51) Int. Cl.
H01L 51/52 (2006.01)
H01L 51/00 (2006.01)
H01L 51/50 (2006.01)
H01L 27/32 (2006.01)

(52) U.S. Cl.
CPC ...... *H01L 51/0013* (2013.01); *H01L 27/3211* (2013.01); *H01L 51/508* (2013.01); *H01L 51/5064* (2013.01)

(58) Field of Classification Search
USPC ..................................... 257/40, 89, E51.018
See application file for complete search history.

(56) References Cited

U.S. PATENT DOCUMENTS

| 2007/0205411 A1 | 9/2007 | Itai | |
|---|---|---|---|
| 2008/0284317 A1* | 11/2008 | Liao et al. | 313/504 |
| 2010/0156279 A1* | 6/2010 | Tamura et al. | 313/504 |

(Continued)

FOREIGN PATENT DOCUMENTS

| EP | 2299784 A1 | 3/2011 |
|---|---|---|
| JP | 2003-249351 | 9/2003 |

(Continued)

OTHER PUBLICATIONS

Merriam-Webster OnLine definition of "encompass." No date.*

*Primary Examiner* — Hrayr A Sayadian
(74) *Attorney, Agent, or Firm* — Robert E. Bushnell, Esq.

(57) ABSTRACT

An organic light emitting diode (OLED) display includes a red pixel, a green pixel, and a blue pixel. The red pixel, the green pixel and the blue pixel each includes: a pixel electrode; a hole auxiliary layer on the pixel electrode; a blue organic emission layer on the hole auxiliary layer; an electron auxiliary layer on the blue organic emission layer; and a common electrode on the electron auxiliary layer. The red pixel and the green pixel include: a red boundary layer and a green boundary layer, respectively; a red resonance assistance layer and a green resonance assistance layer, respectively; and a red organic emission layer and a green organic emission layer formed between the red resonance assistance layer and the blue organic emission layer, and between the green resonance assistance layer and the blue organic emission layer, respectively.

10 Claims, 11 Drawing Sheets

(56) References Cited

U.S. PATENT DOCUMENTS

2011/0089412 A1 4/2011 Fujimori et al.
2014/0021460 A1* 1/2014 Tanida et al. .................. 257/40
2014/0374707 A1* 12/2014 Seo ..................... H01L 27/3211
　　　　　　　　　　　　　　　　　　　　　　257/40

FOREIGN PATENT DOCUMENTS

| KR | 10-0635583 B1 | 10/2006 |
|---|---|---|
| KR | 10-2010-0015029 | 2/2010 |
| KR | 10-2010-0023878 A | 3/2010 |
| KR | 10-2010-0036645 | 4/2010 |
| KR | 10-2011-0025904 A | 3/2011 |

\* cited by examiner

ORGANIC LIGHT EMITTING DIODE DISPLAY AND MANUFACTURING METHOD THEREOF

CLAIM OF PRIORITY

This application makes reference to, incorporates the same herein, and claims all benefits accruing under 35 U.S.C. §119 from an application earlier filed in the Korean Intellectual Property Office on the 18 of Aug. 2011 and there duly assigned Serial No. 10-2011-0082260.

BACKGROUND OF THE INVENTION

Field of the Invention

The present invention relates generally to an organic light emitting diode (OLED) display and a manufacturing method thereof.

Description of the Related Art

An organic light emitting device includes two electrodes and an organic light emitting layer interposed therebetween. One of the two electrodes injects holes and the other injects electrons into the light emitting layer. The injected electrons and holes are combined to form excitons and the excitons emit light as discharge energy.

Among methods of forming red, green and blue emission layers to realize full color of the organic light emitting diode (OLED) display, there is a laser induced thermal imaging using a laser.

In laser induced thermal imaging, a laser beam generated from a laser beam generator is patterned by using a mask pattern, and the patterned laser beam is irradiated on a donor film, including a base film and a transfer layer, to expand and to transfer a portion of the transfer layer to the organic light emitting diode (OLED) display, thereby forming an emission layer for the organic light emitting diode (OLED) display. As a result, there are advantages in that each emission layer may be precisely patterned, and the laser induced thermal imaging is a dry process.

The transfer layer is made of a single layer of the organic emission layer or a dual layer of the organic emission layer and a resonance assistance layer, and when the transfer layer is made to the single layer of the organic emission layer, thermal energy is transmitted to a hole transport layer (HTL) in the laser induced thermal imaging process such that a carrier accumulation is generated in an interface between the hole transport layer (HTL) and the organic emission layer, and thereby a characteristic of the organic light emitting element may be deteriorated.

Also, when the transfer layer is made of the dual layer of the organic emission layer and the resonance assistance layer, performance of the interface between the resonance assistance layer and the organic emission layer is improved, but the carrier accumulation is generated in the interface between the hole transport layer (HTL) and the organic emission layer such that the characteristic of the organic light emitting element may be deteriorated.

Also, thermal damage to the resonance assistance layer and the hole transport layer (HTL) is serious because of the thermal energy generated when using the laser induced thermal imaging such that the driving voltage may be excessively increased.

Also, when using the laser induced thermal imaging, heat is transmitted to the anode such that the interface characteristic between the anode and the hole injection layer (HIL) may be deteriorated.

The above information disclosed in this Background section is only for enhancement of an understanding of the background of the described technology, and therefore it may contain information that does not form the prior art that is already known in this country to a person of ordinary skill in the art.

SUMMARY OF THE INVENTION

The present invention provides an organic light emitting diode (OLED) display that minimizes thermal damage to an interface between a transfer layer and a hole transport layer (HTL) by laser induced thermal imaging and improves a carrier transmission ratio, and a manufacturing method thereof.

An organic light emitting diode (OLED) display according to an exemplary embodiment may include a red pixel, a green pixel and a blue pixel, wherein the red pixel, the green pixel and the blue pixel respectively include: a pixel electrode; a hole auxiliary layer on the pixel electrode; a blue organic emission layer on the hole auxiliary layer; an electron auxiliary layer on the blue organic emission layer; and a common electrode on the electron auxiliary layer. The red pixel and the green pixel include: a red boundary layer and a green boundary layer, respectively, on the hole auxiliary layer; a red resonance assistance layer and a green resonance assistance layer, respectively, on the red boundary layer and the green boundary layer; and a red organic emission layer and a green organic emission layer, respectively, formed between the red resonance assistance layer and the blue organic emission layer and between the green resonance assistance layer and the blue organic emission layer, respectively.

The red boundary layer and green boundary layer may include NDP-9(2-(7-dicyanomethylene-1,3,4,5,6,8,9,10-octafluoro-7H-pyrene-2-ylidene)-malononitrile) or HAT-CN (1,4,5,8,9,11-hexaazatriphenylene-hexacarbonitrile).

The red boundary layer and green boundary layer may include a material having a melting point of 80° C. to 170° C.

The hole auxiliary layer may include a hole injection layer (HIL) on the pixel electrode and a hole transport layer (HTL) on the hole injection layer (HIL), and the electron auxiliary layer may include an electron transport layer (ETL) on the blue organic emission layer and an electron injection layer (EIL) on the electron transport layer (ETL).

The organic light emitting diode (OLED) display may further include a reflective layer formed under the pixel electrode.

The organic light emitting diode (OLED) display may further include a pixel boundary layer between the pixel electrode and the hole injection layer (HIL).

The pixel boundary layer may be formed with the same material as the red boundary layer and the green boundary layer.

The organic light emitting diode (OLED) display may further include an assistance pixel boundary layer formed inside the hole injection layer (HIL).

The organic light emitting diode (OLED) display may further include an assistance pixel boundary layer formed inside the hole transport layer (HTL).

The organic light emitting diode (OLED) display may further include an assistance pixel boundary layer formed between the hole injection layer (HIL) and the hole transport layer (HTL).

A method of manufacturing an organic light emitting diode (OLED) display according to an exemplary embodiment may include: forming a thin film transistor, a pixel electrode, and a hole auxiliary layer on a substrate; forming a donor film including a base film and a transfer layer; and transferring the transfer layer of the donor film on the hole auxiliary layer of the substrate by using a laser; wherein the transfer layer includes an organic emission layer, a resonance assistance layer formed on the organic emission layer, and a boundary layer formed on the resonance assistance layer.

The method may further include annealing the transfer layer at the same temperature as the melting point of the boundary layer, and the boundary layer may be formed with a material having a melting point of 80° C. to 170° C.

The organic emission layer may include a red organic emission layer and a green organic emission layer, the resonance assistance layer may include a red resonance assistance layer formed on the red organic emission layer and a green resonance assistance layer formed on the green organic emission layer, and the boundary layer may include a red boundary layer formed on the red resonance assistance layer and a green boundary layer formed on the green resonance assistance layer.

The red boundary layer may be formed between the hole auxiliary layer and the red resonance assistance layer, and the green boundary layer may be formed between the hole auxiliary layer and the green resonance assistance layer.

The hole auxiliary layer may include a hole injection layer (HIL) formed on the pixel electrode and a hole transport layer (HTL) formed on the hole injection layer (HIL), and the electron auxiliary layer may include an electron transport layer (ETL) formed on the blue organic emission layer and an electron injection layer (EIL) formed on the electron transport layer (ETL).

The method may further include forming a pixel boundary layer on the pixel electrode, and the hole injection layer (HIL) may be formed on the pixel boundary layer.

The pixel boundary layer may be formed with the same material as the red boundary layer and the green boundary layer.

The method may further include forming an assistance pixel boundary layer inside the hole injection layer (HIL).

The method may further include forming an assistance pixel boundary layer inside the hole transport layer (HTL).

The method may further include forming an assistance pixel boundary layer between the hole injection layer (HIL) and the hole transport layer (HTL).

According to the exemplary embodiments, the boundary layer is formed between the resonance assistance layer and the hole transport layer (HTL), and under a laser induced thermal imaging process, thermal damage to the resonance assistance layer and the hole transport layer (HTL) by thermal energy may be minimized, and the interface characteristic, such as the carrier transmission ratio of the interface between the resonance assistance layer and the hole transport layer (HTL), may be improved.

Also, thermal damage to the resonance assistance layer and the hole transport layer (HTL) is minimized such that a serious increase of the driving voltage may be prevented, and thereby reliability of the product may be improved.

Furthermore, the pixel boundary layer is formed between the pixel electrode and the hole injection layer (HIL), and is formed such that thermal damage to the pixel electrode by the laser induced thermal imaging process may be minimized.

Also, the boundary layer is formed with a material having a low melting point for the transfer of the laser with low energy and the annealing such that the interface characteristic of the interface may be improved.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
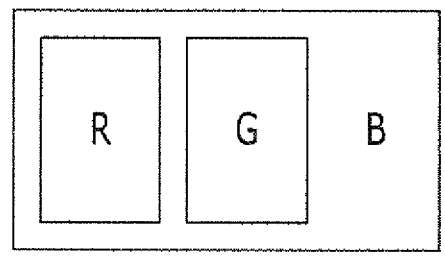
FIG. 1 is a top plan view schematically showing an arrangement of a pixel of an organic light emitting diode (OLED) display according to a first exemplary embodiment of the invention.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

Like reference numerals designate like elements throughout the specification. Furthermore, the size and thickness of each element are displayed in the drawings are arbitrarily described for better understanding and ease of description, and the present invention is not limited to the described size and thickness.

Now, an organic light emitting diode (OLED) display according to the first exemplary embodiment will be described with reference to FIG. 1 to FIG. 3.

FIG. 1 is a top plan view schematically showing an arrangement of a pixel of an organic light emitting diode (OLED) display according to a first exemplary embodiment of the invention.

As shown in FIG. 1, an organic light emitting diode (OLED) display according to the first exemplary embodiment includes a red pixel (R) displaying a red color, a green pixel (G) displaying a green color, and a blue pixel (B) displaying a blue color. The set of the red color, the green color, and the blue color is one example of basic colors to display full colors, and red pixels R, green pixels G, and blue pixels B may be basic pixels to display full colors. In the present exemplary embodiment, three pixels forming one group are repeated according to a row and column.

In detail, regarding to the arrangement of the red pixel R, the green pixel G, and the blue pixel B, a plurality of red pixels R and a plurality of green pixels G are alternately arranged according to rows. The red pixel R, the green pixel G, and the blue pixel B may have substantially the same area.

FIG. 1 shows a region of the blue pixel B enclosing the red pixel R and the green pixel G, and this means that the blue organic emission layer is formed on the whole surface as well as the region of the blue pixel B. In this way, the shape and arrangement of the pixels may be variously changed, and a different pixel, such as a white pixel displaying a white color, may be further included.

Next, one pixel of an organic light emitting device according to an exemplary embodiment will be described with reference to FIG. 2 as well as the above-described FIG. 1.

Figure 2:
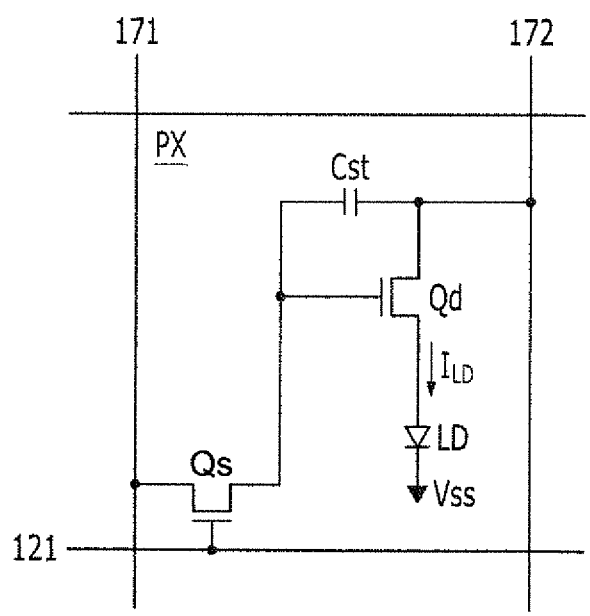
FIG. 2 is an equivalent circuit of one pixel of an organic light emitting diode (OLED) display according to the first exemplary embodiment.

FIG. 2 is an equivalent circuit of one pixel of an organic light emitting diode (OLED) display according to the first exemplary embodiment.

Referring to FIG. 2, an organic light emitting diode (OLED) display according to the present exemplary embodiment includes a plurality of signal lines 121, 171 and 172, and a pixel PX connected thereto. The pixel PX may be one of the red pixel R, the green pixel G, and the blue pixel B shown in FIG. 1.

The signal lines include a plurality of scanning signal lines 121 for transmitting gate signals (or scanning signals), a plurality of data lines 171 for transmitting data signals, and a plurality of driving voltage lines 172 for transmitting a driving voltage. The scanning signal lines 121 extend substantially in a row direction and substantially parallel to each other, and the data lines 171 extend substantially in a column direction and substantially parallel to each other. The driving voltage lines 172 extend substantially in a column direction and substantially parallel to each other, but they may extend in the row direction or the column direction, and may form a mesh shape.

One pixel PX includes a switching transistor Qs, a driving transistor Qd, a storage capacitor Cst, and an organic light emitting element LD.

The switching transistor Qs has a control terminal connected to one of the gate lines 121, an input terminal connected to one of the data lines 171, and an output terminal connected to the driving transistor Qd. The switching transistor Qs transmits data signals applied to the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting element LD. The driving transistor Qd drives an output current ILD having a magnitude depending on the voltage between the control terminal and the output terminal thereof.

The capacitor Cst is connected between the control terminal and the input terminal of the driving transistor Qd. The capacitor Cst stores a data signal applied to the control terminal of the driving transistor Qd, and maintains the data signal after the switching transistor Qs turns off.

The organic light emitting element LD, as an organic light emitting diode (OLED), has an anode connected to the output terminal of the driving transistor Qd and a cathode connected to a common voltage Vss. The organic light emitting element LD emits light having an intensity depending on an output current ILD of the driving transistor Qd, thereby displaying images. The organic light emitting element LD may include an organic material uniquely emitting at least one of three primary colors of red, green and blue, and the organic light emitting device displays desired images by a spatial sum thereof.

The switching transistor Qs and the driving transistor Qd are n-channel field effect transistors (FETs), but at least one may be a p-channel FET. In addition, the connections among the transistors Qs and Qd, the capacitor Cst, and the organic light emitting diode LD may be modified.

Next, a cross-sectional structure of an organic light emitting device according to an exemplary embodiment will be described with reference to FIG. 3 as well as FIG. 2.

Figure 3:
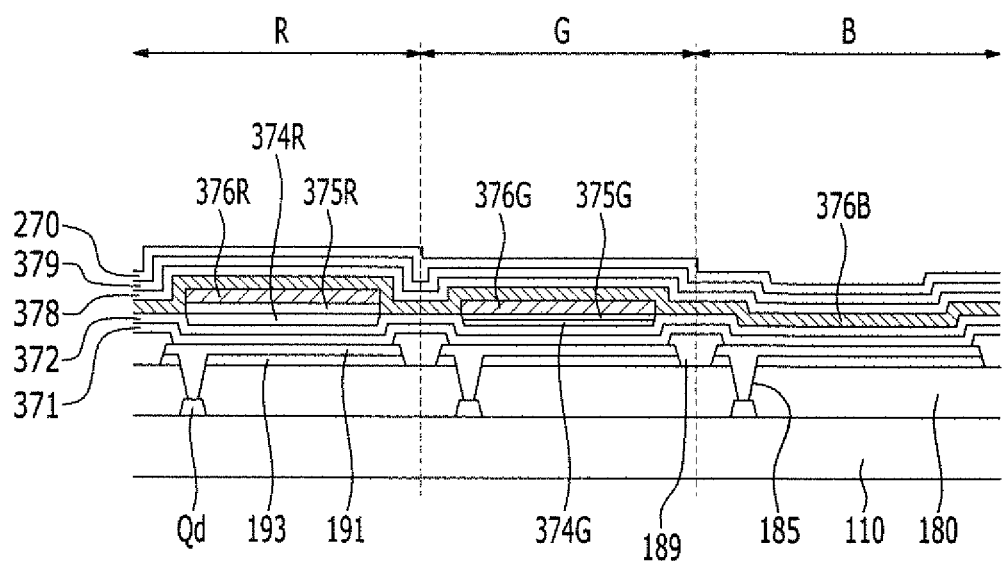
FIG. 3 is a cross-sectional view of three pixels of an organic light emitting diode (OLED) display according to the first exemplary embodiment.

FIG. 3 is a cross-sectional view of three pixels in an organic light emitting device according to the first exemplary embodiment.

A plurality of driving transistors Qd are formed on an insulation substrate 110 made of transparent glass or plastic. Also, a plurality of signal lines (not shown) and a plurality of switching transistors (not shown) may be further formed on the insulation substrate 110.

A passivation layer 180 made of an inorganic material or an organic material is formed on the driving transistors Qd. When the passivation layer 180 is made of the organic material, the surface thereof may be flat.

The passivation layer 180 has a contact hole 185 exposing the driving transistor Qd.

A pixel electrode 191 is formed on the passivation layer 180 of each pixel R, G, and B. The pixel electrode 191 may be made of a transparent conductive oxide such as ITO (indium tin oxide) or IZO (indium zinc oxide).

A reflective layer 193 is positioned between the passivation layer 180 and the pixel electrode 191. The reflective layer 193 may be made of a metal having a high reflectance, such as silver (Ag) or aluminum (Al), or alloys thereof.

A pixel defining layer 189 covering the edge circumference of the pixel electrode 191 is formed on the passivation layer 180.

A hole auxiliary layer is formed on the whole surface on the pixel electrode 191 in the red, green, and blue pixels R, G, and B, and the hole auxiliary layer includes a hole injection layer (HIL) 371 and a hole transport layer (HTL) 372 deposited thereon.

A red boundary layer 374R and a green boundary layer 374G are respectively formed on the hole transport layer (HTL) 372 of the red pixel R and the hole transport layer (HTL) 372 of the green pixel G. A red resonance assistance layer 375R is formed on the red boundary layer 374R and a green resonance assistance layer 375G is formed on the green boundary layer 374G.

As described above, the red boundary layer 374R is formed between the red resonance assistance layer 375R and the hole transport layer (HTL) 372, and the green boundary layer 374G is formed between the green resonance assistance layer 375G and the hole transport layer (HTL) 372. The boundary layers 374R and 374G may be formed of a material such as NDP-9(2-(7-dicyanomethylene-1,3,4,5,6,8, 9,10-octafluoro-7H-pyrene-2-ylidene)-malononitrile), HAT-CN (1,4,5,8,9,11-hexaazatriphenylene-hexacarbonitrile) as a pyrene derivative.

Also, the boundary layers 374R and 374G may include a material having a melting point of 80° C. to 170° C. A material having this melting point may be NPB (N,N-di (naphthalene-1-yl)-N,N-diphenyl-benzidene) or a TPA (triphenylamine).

In detail, as a donor film, when transferring the resonance assistance layers 375R and 375G and the organic emission layers 376R and 376G on the hole transport layer (HTL) 372 to the insulation substrate 110, the transferring process is progressed by forming the boundary layers 374R and 374G under the resonance assistance layers 375R and 375G as the donor film. Accordingly, the boundary layers 374R and 374G, the resonance assistance layers 375R and 375G, and the organic emission layers 376R and 376G are simultaneously transferred to the hole transport layer (HTL) 372. Here, the boundary layers 374R and 374G are disposed between the resonance assistance layers 375R and 375G and the hole transport layer (HTL) 372, and under the laser induced thermal imaging process, thermal damage to the resonance assistance layers 375R and 375G and hole transport layer (HTL) 372 by the thermal energy may be minimized, and the interface characteristic of the interface between the resonance assistance layers 375R and 375G and the hole transport layer (HTL) 372 may be improved.

Also, thermal damage to the resonance assistance layers 375R and 375G and hole transport layer (HTL) 372 is minimized such that an error increasing the driving voltage may be prevented, thereby improving reliability of the product.

The thickness of the boundary layer 374 may be in the range of 5 nm to 20 nm. When the thickness of the boundary layer 374 is less than 5 nm, it is difficult to prevent carrier accumulation, and when the thickness of the boundary layer 374 is more than 20 nm, the carrier transmission ratio may be deteriorated.

On the other hand, the red resonance assistance layer 375G formed on the red boundary layer 374R is thicker than the green resonance assistance layer 375G formed on the green boundary layer 374G. The red resonance assistance layer 375G and the green resonance assistance layer 375G, as added layers to control the resonance distance for each color, may be made of the same material as the hole transport layer (HTL) 372. Although the thickness of the hole transport layer 372 is increased, it is not necessary to accompany that with an increase in the amount of the current such that the distance between additional members 375G and 375B for controlling the resonance distance may be applied.

The red organic emission layer 376R is deposited on the red resonance assistance layer 375R of the red pixel R, and the green organic emission layer 376G is deposited on the green resonance assistance layer 375G of the green pixel G. Also, the blue organic emission layer 376B is deposited on the whole surface of the hole transport layer (HTL) 372 of the blue pixel B and the red and green organic emission layers 376R and 376G. The red, green, and blue organic emission layers 376R, 376G, and 376B may be made of an organic material uniquely emitting light of red, green, and blue, respectively.

Also, to prevent color mixture, the organic light emitting material having hole mobility of the host of the red and green organic emission layers 376R and 376G that is less than the hole mobility of the host of the blue organic emission layer 376B may be used for the electrons and holes to be combined, and the light to be emitted in the red and green organic emission layers 376R and 376G of the red and green pixels R and G, and the thickness of the organic emission layers 376R, 376G, and 376B may be appropriately controlled. The red and green organic emission layers 376R and 376G may be made of a hole transmitting material of a triphenylamino group such as NPB (N,N-di(naphthalene-1-yl)-N,N-diphenyl-benzidene) and TPB (tetraphenyl-benzidine), a carbazole derivative such as CBP (4,4'-N,N'-dicarbazole-biphenyl), mCP (N,N-dicarbazolyl-3,5-benzene), and TcTa (4,4',4"-tri(N-carbazolyl)triphenylamine), and a metallic complex such as ZnPBO (phenyloxazole) and ZnPBT (phenylthiazole).

An electron auxiliary layer is formed on the whole surface of the blue organic emission layer 376B, and the electron auxiliary layer includes an electron transport layer (ETL) 378 and an electron injection layer (EIL) 379.

The hole injection layer (HIL) 371, the hole transport layer (HTL) 372, the electron transport layer (ETL) 378, and the electron injection layer (EIL) 379 are provided to improve the luminous efficiency of the organic emission layers 376R, 376G, and 376B, the hole transport layers (HTL) 372 and the electron transport layer (ETL) 378 are provided to balance the electrons and the holes, and the hole injection layer (HIL) 371 and the electron injection layer (EIL) 379 are provided to enhance the injection of the electrons and holes.

The hole injection layer (HIL) 371, the hole transport layer (HTL) 372, the boundary layers 374R and 374G, the resonance assistance layers 375G and 375R, the organic emission layers 376R, 376G, and 376B, the electron transport layer (ETL) 378, and the electron injection layer (EIL) 379 together form the organic light emitting member 370.

A common electrode 270 transmitting a common voltage Vss is formed on the electron injection layer 379. The common electrode 270 is made of two layers including a lower layer and an upper layer, and has a transflective characteristic of reflecting a portion of light and transmitting the rest. Even if the lower layer and the upper layer are made of a metal having the characteristic of reflecting light, if the thickness thereof is thin, the metal has a transflective characteristic in which incident light is both reflected and transmitted. Also, the common electrode 270 may be made of a single layer.

An encapsulation layer (not shown) may be formed on the common electrode 270. The encapsulation layer encapsulates the organic light emitting member 370 and the common electrode 270, thereby preventing penetration of moisture and/or oxygen from the outside.

In the organic light emitting diode (OLED) display, a pixel electrode 191, a light emitting member 370, and the common electrode 270 form an organic light emitting diode LD. The pixel electrode 191 may receive a voltage from the driving transistor Qd through the contact hole 185 of the passivation layer 180.

This organic light emitting device displays images by emitting light toward the common electrode 270. The light emitted from the organic emission layers 373R, 373G, and 373B toward the common electrode 270 arrives at the common electrode 270, and then a portion of the light passes through the common electrode 270 to the outside, and the rest is reflected toward the pixel electrode 191. The pixel electrode 191 again reflects the light toward the common electrode 270. Accordingly, the light reciprocating between the pixel electrode 191 and the common electrode 270 generates interference, and light having a wavelength corresponding to the distance generating the resonance as the distance between the pixel electrode 191 and the common electrode 270 generates constructive interference, and thereby the intensity of the corresponding light is enhanced, but the light of the remaining wavelengths generates a destructive interference, and thereby the intensity thereof is weakened. The reciprocating and interference processes are referred to as a microcavity effect.

In the above-described exemplary embodiment, the pixel electrode 191 has the reflective layer 193 and the common electrode 270 has the transflective characteristic such that a top emission type in which the light is emitted through the common electrode 270 is described, and if the reflective layer 193 of the pixel electrode 191 is replaced with a transflective layer and the common electrode 270 is thick so as to reflect the light, an organic light emitting device of a bottom emission type in which the light is emitted through the substrate 110 may be obtained.

Next, a manufacturing method of an organic light emitting diode (OLED) display according to the first exemplary embodiment will be described with reference to FIG. 3 and FIG. 4.

Figure 4:
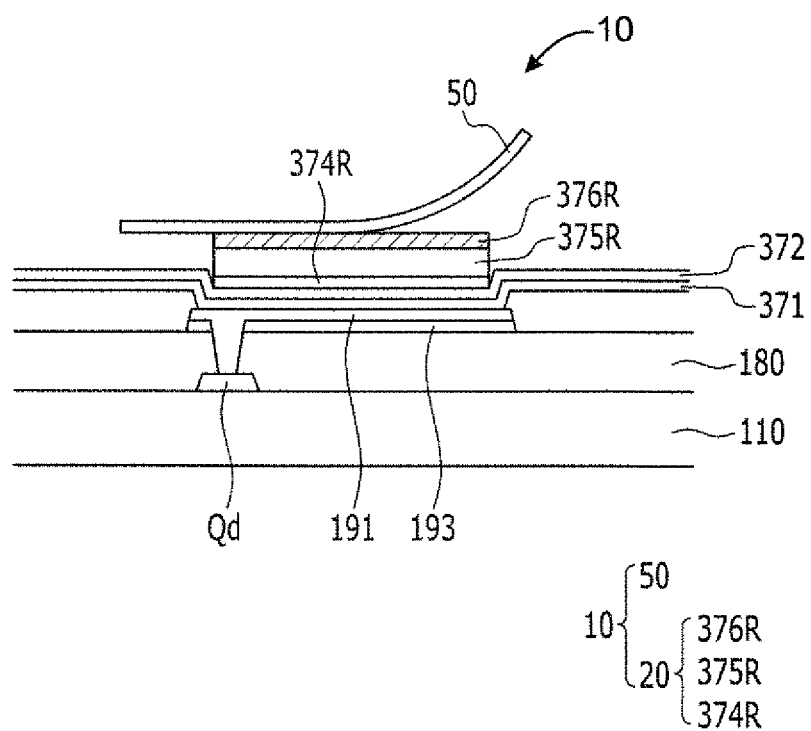
FIG. 4 is a view showing a step of transferring a donor film to a hole transport layer (HTL) of a red pixel according to a manufacturing method of an organic light emitting diode (OLED) display according to the first exemplary embodiment.

FIG. 4 is a view showing a step of transferring a donor film on a hole transport layer (HTL) of a red pixel according to a manufacturing method of an organic light emitting diode (OLED) display according to the first exemplary embodiment.

Firstly, referring to FIG. 3, a plurality of driving transistors Qd are formed on an insulation substrate 110, and a passivation layer 180 having a plurality of contact holes 185 is formed thereon.

Next, a reflective layer and a conductive oxide member are sequentially deposited and patterned on the passivation layer 180 of the pixels R, G, and B to form a pixel electrode 191.

Next, the hole injection layer (HIL) 371 and the hole transport layer (HTL) 372 are sequentially deposited.

Next, as shown in FIG. 4, a donor film 10 formed with the red organic emission layer 376R is disposed on the hole transport layer (HTL) 372 of the substrate 110 formed with the pixel electrode 191. The donor film 10 has such a structure that a base film 50 and a transfer layer 20 are sequentially deposited.

The base film 50 is transparent so as to transmit light to a thermal conversion layer, and may be made of a material having an appropriate optical characteristic and sufficient mechanical stability. For example, the base film 50 may be made of at least one high molecular material selected from a group including polyester, polyacryl, polyepoxy, polyethylene, polystyrene, and polyethylene terephthalate, or of glass.

The thermal conversion layer may be formed between the base film 50 and the transfer layer 20, and the thermal conversion layer absorbs light of an infrared to visible ray range so as to convert the light into heat of more than a predetermined range such that it is preferable for the thermal conversion layer to have an appropriate optical density and to include a light absorption material for light absorption. In this regard, the thermal conversion layer may be made of a metal layer of Al, Ag, or oxides or sulfides thereof, or of an organic layer made of a high molecular weight material including carbon black, graphite, and an infrared ray dye.

The transfer layer 20, as a layer that is separated from the donor film 10 by thermal energy transmitted from the thermal conversion layer and is transferred to the substrate 110 formed with the hole transport layer (HTL) 372, has a structure in which the red organic emission layer 376R, the red resonance assistance layer 375R, and the red boundary layer 374R are sequentially deposited.

In addition, the hole transport layer (HTL) 372 is uniformly laminated onto the red boundary layer 374R of the donor film 10. Also, a laser is irradiated onto donor film 10 contacting the hole transport layer (HTL) 372 such that the transfer layer 20 of the donor film 10 is transferred to the substrate 110. Accordingly, the red boundary layer 374R, the red resonance assistance layer 375R, and the red organic emission layer 376R are sequentially deposited on the hole transport layer (HTL) 372 of the substrate 110.

As described above, under the laser induced thermal imaging process, the red boundary layer 374R is formed on the red resonance assistance layer 375R of the donor film 10 so as to transfer the red boundary layer 374R onto the hole transport layer (HTL) 372 such that thermal damage to the red resonance assistance layer 375R and the hole transport layer (HTL) 372 by the thermal energy may be minimized, and the interface characteristic, such as the carrier transmission ratio of the interface between the red resonance assistance layer 375R and the hole transport layer (HTL) 372, may be improved.

In the latter regard, when the red boundary layer 374R is formed with a material having the melting point of 80° C. to 170° C., a small energy laser is irradiated so as to transfer the red boundary layer 374R onto the hole transport layer (HTL) 372, and the annealing process is progressed with a temperature of 80° C. to 170° C. for about 5 minutes so as to attach the red boundary layer 374R to the hole transport layer (HTL) 372.

As described above, the small energy laser is irradiated such that thermal damage to the red resonance assistance layer 375R by the laser may be prevented, and the interface characteristic, such as the life-span of the interface between the red boundary layer 374R and the hole transport layer (HTL) 372, and the power consumption may be improved through the annealing process.

Next, a green organic emission layer 376G is formed with the above process. That is, the donor film 10 formed with the green organic emission layer 376G is transferred to the hole transport layer (HTL) 372 of the substrate 110 formed with the pixel electrode 191 such that the green boundary layer 374G, the green resonance assistance layer 375G, and the green organic emission layer 376G are formed on the hole transport layer (HTL) 372 of the green pixel (G). Also, in this case, under the laser induced thermal imaging process, the green boundary layer 374G is formed on the green resonance assistance layer 375G of the donor film 10 and is transferred to the hole transport layer (HTL) 372 such that thermal damage to the green resonance assistance layer 375G and the hole transport layer (HTL) 372 by the thermal energy may be minimized, and the interface characteristic of the carrier transmission ratio of the interface between the green resonance assistance layer 375G and the hole transport layer (HTL) 372 may be improved.

Next, as shown in FIG. 3, the blue organic emission layer 376B is deposited on the red organic emission layer 376R, the green organic emission layer 376G, and the hole transport layer (HTL) 372 of the blue pixel (B) under vacuum conditions. The blue organic emission layer 376B is weak with regard to the thermal energy of the laser such that the blue organic emission layer 376B is deposited on the whole surface without the usage of the laser induced thermal imaging.

Next, the electron transport layer (ETL) 378, the electron injection layer (EIL) 379, and the common electrode 270 are sequentially deposited on the blue organic emission layer 376B, and an encapsulation layer is formed to complete the organic light emitting diode (OLED) display.

Figure 5:
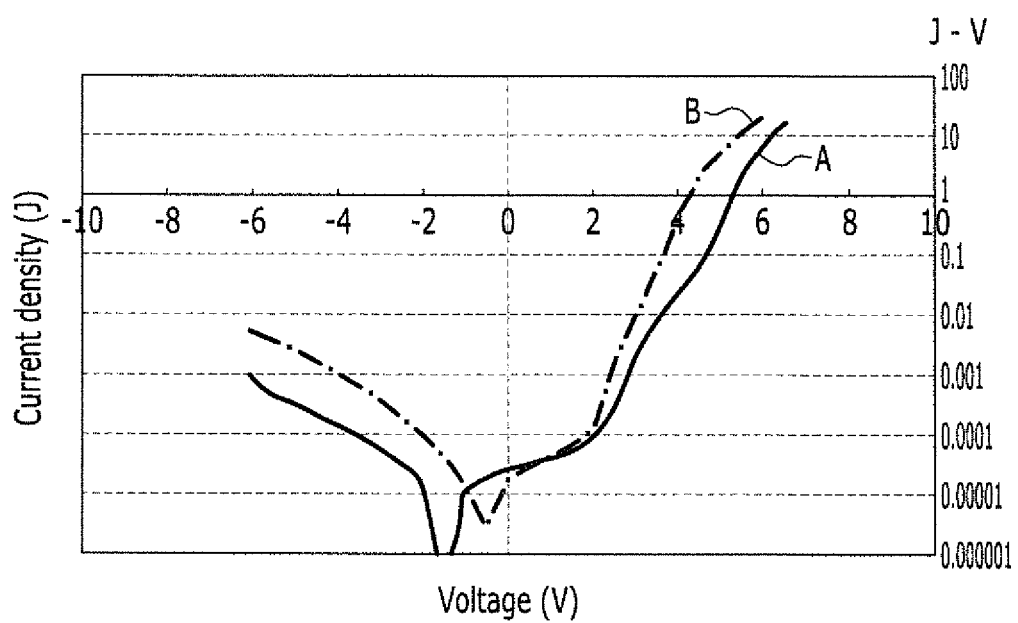
FIG. 5 is a graph comparing a correlation of voltage and current density in an organic light emitting diode (OLED) display according to the first exemplary embodiment and a comparative example.
Figure 6:
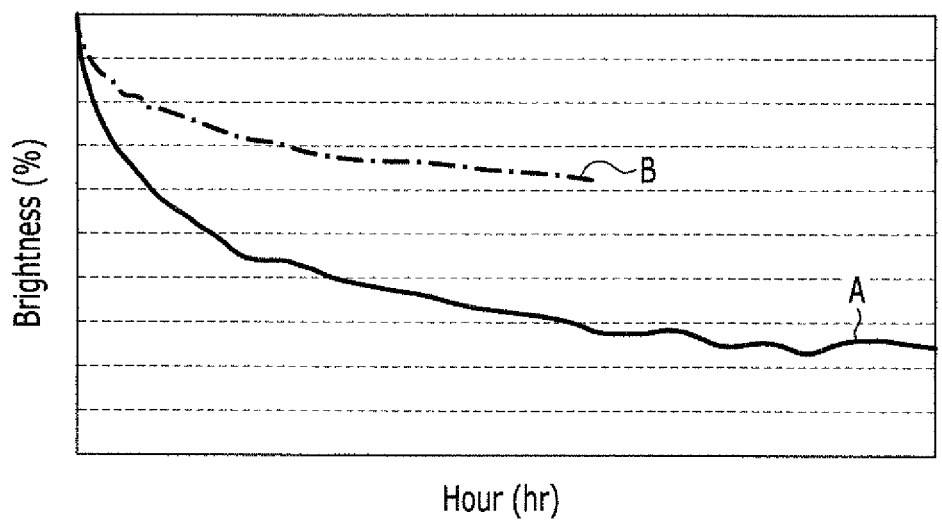
FIG. 6 is a graph comparing a life-span of an organic light emitting diode (OLED) display according to the first exemplary embodiment and a comparative example.

FIG. 5 is a graph comparing a correlation of voltage and current density in an organic light emitting diode (OLED) display according to the first exemplary embodiment and a comparative example, and FIG. 6 is a graph comparing a life-span of an organic light emitting diode (OLED) display according to the first exemplary embodiment and a comparative example.

As shown in FIG. 5, power consumption of the present exemplary embodiment B is improved by about 1V compared to Comparative Example A, and as shown in FIG. 6, the present exemplary embodiment B maintains initial brightness for a long time such that the life-span of the present exemplary embodiment is improved by about two times compared to Comparative Example A.

On the other hand, in the first exemplary embodiment, the boundary layer is formed between the resonance assistance layer and the hole transport layer (HTL), but a pixel boundary layer maybe formed between the pixel electrode and the hole injection layer (HIL).

Next, referring to FIG. 7, an organic light emitting diode (OLED) display according to a second exemplary embodiment will be described.

Figure 7:
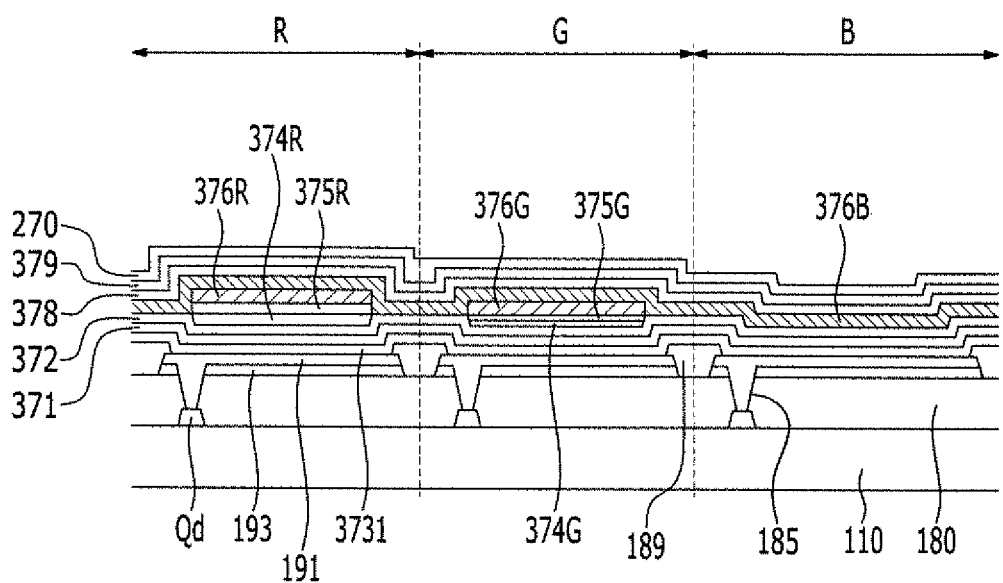
FIG. 7 is a cross-sectional view of three pixels of an organic light emitting diode (OLED) display according to a second exemplary embodiment of the invention.

FIG. 7 is a cross-sectional view of three pixels of an organic light emitting diode (OLED) display according to a second exemplary embodiment of the invention.

The second exemplary embodiment is substantially equivalent to the first exemplary embodiment shown in FIG. 1 to FIG. 3, except for a pixel boundary layer between the pixel electrode and the hole injection layer (HIL) such that the repeated description is omitted.

As shown in FIG. 7, in an organic light emitting diode (OLED) display according to the second exemplary embodiment, a pixel boundary layer 3731 is formed on the whole surface of the pixel electrode 191 in the red, green, and blue pixels R, G, and B. This pixel boundary layer 3731 is made of the same material as the red boundary layer 374R and the green boundary layer 374G.

Also, a hole injection layer (HIL) 371 and a hole transport layer (HTL) 372 are sequentially deposited on the pixel boundary layer 1371.

When the boundary layers 374R and 374G of the donor film 10, the resonance assistance layers 375R and 375G, and the organic emission layers 376R and 376G are simultaneously transferred to the hole transport layer (HTL) 372 through the laser induced thermal imaging, thermal damage due to the thermal energy of the laser is applied to the pixel electrode 191. However, the pixel boundary layer 3731 is formed on the pixel electrode 191 such that thermal damage to the pixel electrode 191 may be minimized and the interface characteristic of the interface between the pixel electrode 191 and the hole injection layer (HIL) 371 may be improved.

The thickness of the pixel boundary layer 3731 may be in the range of 5 nm to 20 nm. When the thickness of the pixel boundary layer 3731 is less than 5 nm, it is difficult to prevent carrier accumulation, and when the thickness of the pixel boundary layer 3731 is more than 20 nm, the carrier transmission ratio may be deteriorated.

Now, a method of manufacturing an organic light emitting diode (OLED) display according to the second exemplary embodiment will be described with reference to FIG. 7 and FIG. 8.

Figure 8:
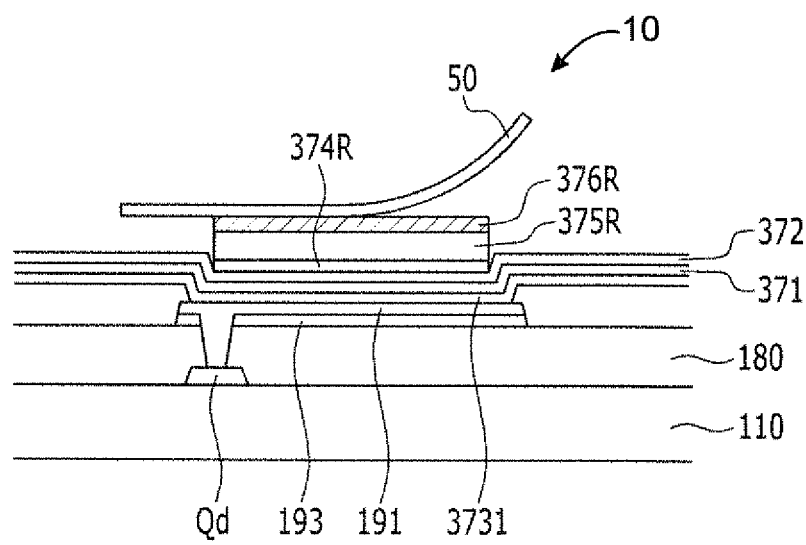
FIG. 8 is a view showing a step of transferring a donor film to a hole transport layer (HTL) of a red pixel according to a manufacturing method of an organic light emitting diode (OLED) display according to the second exemplary embodiment.
Figure 8:
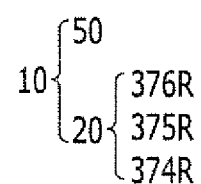

FIG. 8 is a view showing a step of transferring a donor film to a hole transport layer (HTL) of a red pixel according to a manufacturing method of an organic light emitting diode (OLED) display according to the second exemplary embodiment.

As shown in FIG. 7, a pixel boundary layer 3731 is formed on the whole surface of the pixel electrode 191 and the pixel defining layer 189.

Next, the hole injection layer (HIL) 371 and the hole transport layer (HTL) 372 are sequentially deposited on the pixel boundary layer 3731.

Then, as shown in FIG. 8, a donor film 10 formed with the red organic emission layer 376R is disposed on the hole transport layer (HTL) 372 of the substrate 110 formed with the pixel electrode 191. The donor film 10 has a structure in which the base film 50 and the transfer layer 20 are sequentially deposited.

Also, the hole transport layer (HTL) 372 is uniformly contacted (laminated) with the red boundary layer 374R of the donor film 10. Also, the laser is irradiated onto the donor film 10 that contacts the hole transport layer (HTL) 372 so as to transfer the transfer layer 20 of the donor film 10 onto the substrate 110. Accordingly, a red boundary layer 374R, a red resonance assistance layer 375R, and a red organic emission layer 376R are sequentially formed on the hole transport layer (HTL) 372 of the substrate 110.

As described above, the pixel boundary layer 3731 is formed on the pixel electrode 191 such that thermal damage to the pixel electrode 191 by the laser induced thermal imaging process may be minimized, and the interface characteristic of the interface between the pixel electrode 191 and the hole injection layer (HIL) 371 may be improved.

Figure 9:
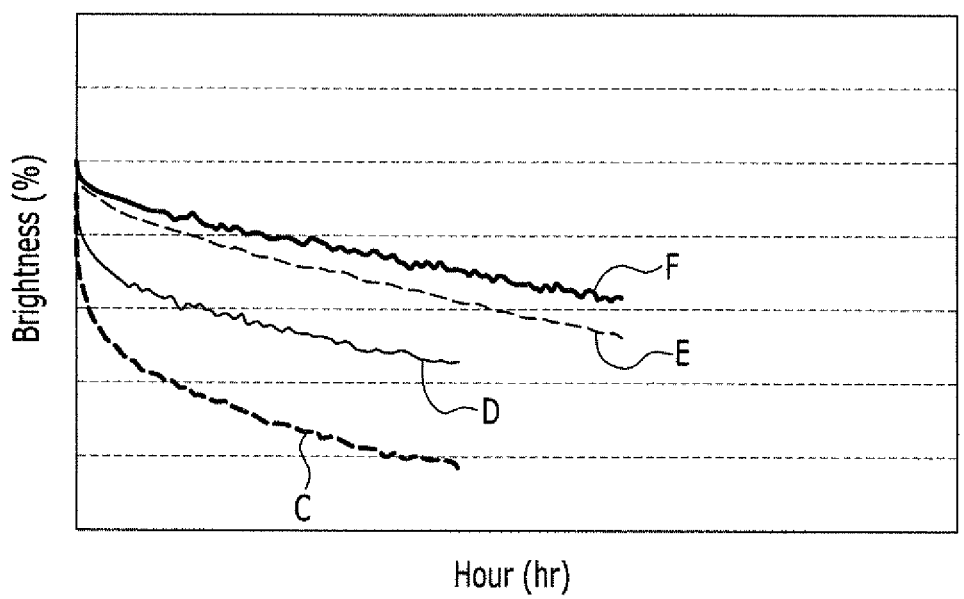
FIG. 9 is a graph comparing a life-span of an organic light emitting diode (OLED) display according to the second exemplary embodiment and a comparative example.

FIG. 9 is a graph comparing a life-span of an organic light emitting diode (OLED) display according to the second exemplary embodiment and a comparative example.

As shown in FIG. 9, the life-span of the green pixel (D) according to the second exemplary embodiment is improved compared to the life-span of the green pixel (C), and the life-span of the red pixel (F) according to the second exemplary embodiment is improved compared to the life-span of the red pixel (E) of the comparative example.

On the other hand, in the second exemplary embodiment, the pixel boundary layer is formed between the pixel electrode and the hole injection layer (HIL), but a sub-pixel boundary layer may be formed inside the hole injection layer (HIL).

Next, an organic light emitting diode (OLED) display according to a third exemplary embodiment will be described with reference to FIG. 10.

Figure 10:
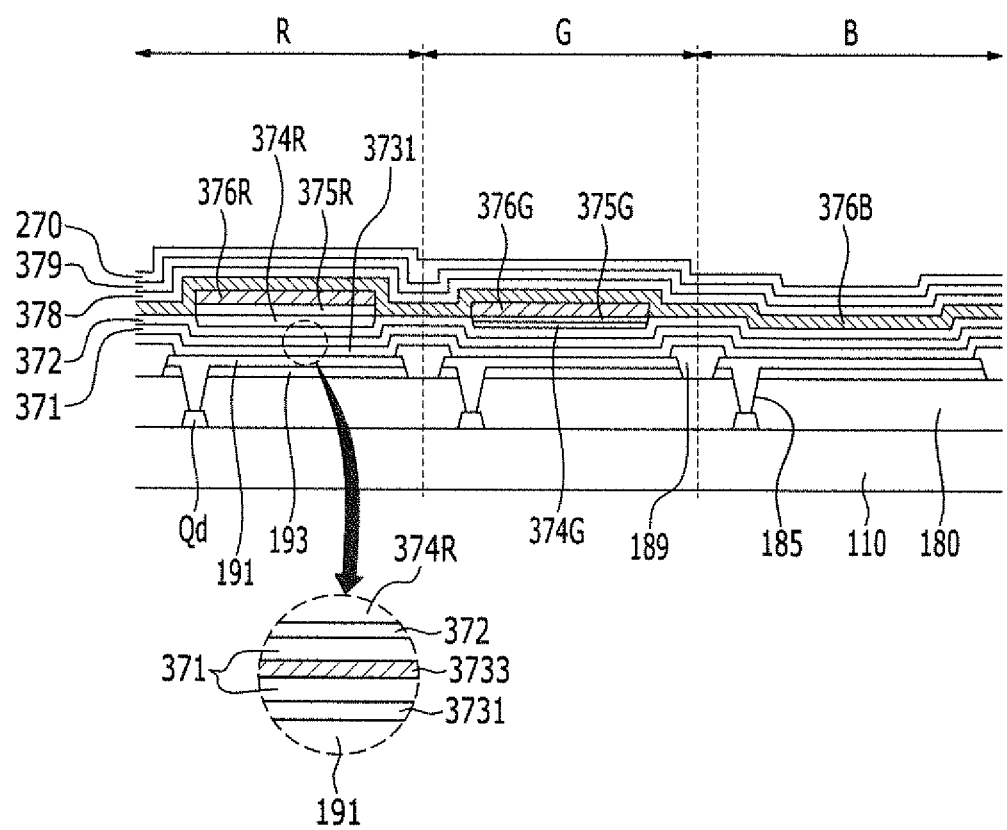
FIG. 10 is a cross-sectional view of three pixels of an organic light emitting diode (OLED) display according to a third exemplary embodiment of the invention.

FIG. 10 is a cross-sectional view of three pixels of an organic light emitting diode (OLED) display according to a third exemplary embodiment of the invention.

The third exemplary embodiment is substantially equivalent to the second exemplary embodiment shown in FIG. 8 except for the sub-pixel boundary layer formed inside the hole injection layer (HIL).

As shown in FIG. 10, in the organic light emitting diode (OLED) display according to the third exemplary embodiment, a pixel boundary layer 3731 is formed on the whole surface on the pixel electrode 191 in the red, the green, and the blue pixels R, G, and B. The pixel boundary layer 3731 is formed with the same material as the red boundary layer 374R and the green boundary layer 374G.

Also, the hole injection layer (HIL) 371 and the hole transport layer (HTL) 372 are sequentially deposited on the pixel boundary layer 3731. At this point, an assistance pixel boundary layer 3733 is formed inside the hole injection layer (HIL) 371. The assistance pixel boundary layer 3733 may be formed with the same material as the pixel boundary layer 3731.

As described above, the pixel boundary layer 3731 is formed on the pixel electrode 191 and the assistance pixel boundary layer 3733 is formed inside the hole injection layer (HIL) 371 such that thermal damage to the pixel electrode 191 may be minimized and the interface characteristic of the interface between the pixel electrode 191 and the hole injection layer (HIL) 371 may be improved.

On the other hand, in the third exemplary embodiment, the assistance pixel boundary layer 3733 is formed inside the hole injection layer (HIL) 371, but the assistance pixel boundary layer 3731 may be formed inside the hole transport layer (HTL) 371 or between the hole injection layer (HIL) 371 and the hole transport layer (HTL) 372.

Next, referring to FIG. 11 and FIG. 12, an organic light emitting diode (OLED) display according to a fourth exemplary embodiment and a fifth exemplary embodiment, respectively, will be described.

Figure 11:
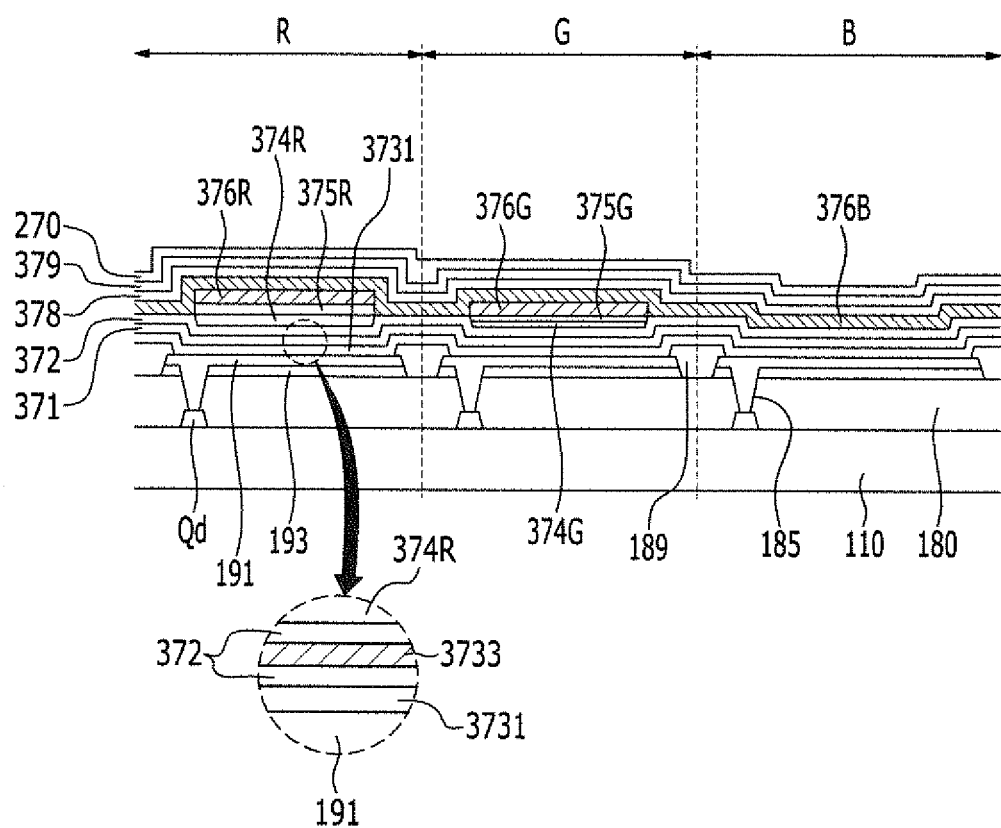
FIG. 11 is a cross-sectional view of three pixels of an organic light emitting diode (OLED) display according to a fourth exemplary embodiment of the invention.
Figure 12:
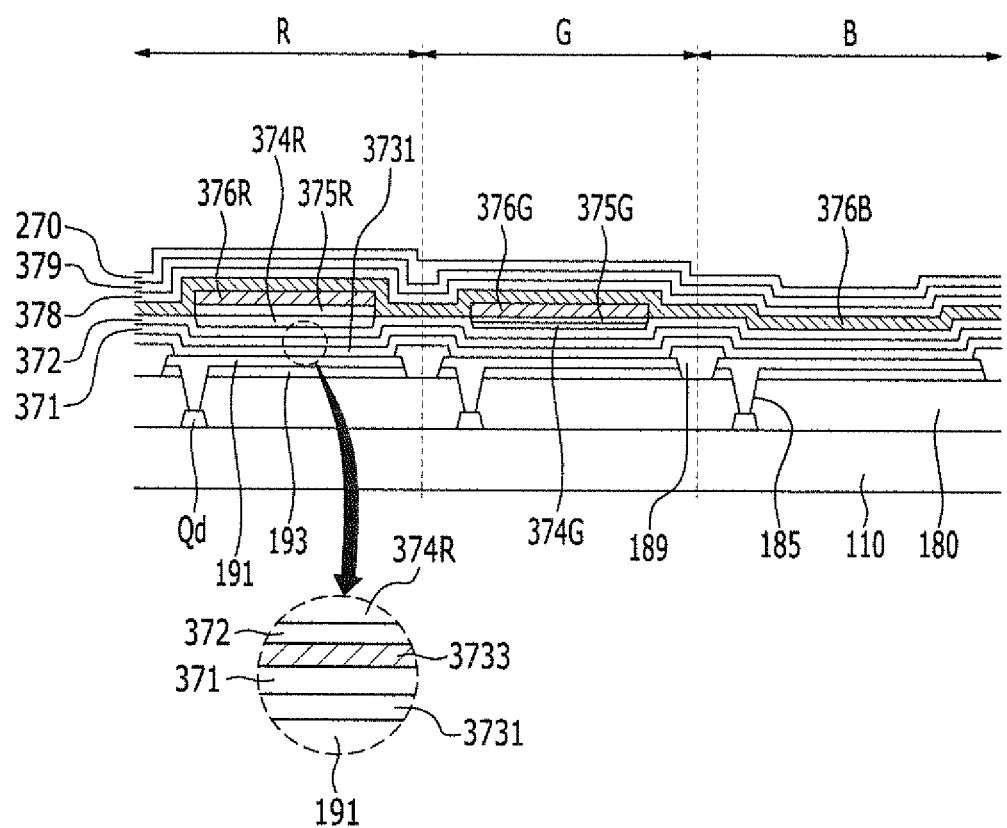
FIG. 12 is a cross-sectional view of three pixels of an organic light emitting diode (OLED) display according to a fifth exemplary embodiment of the invention.

FIG. 11 is a cross-sectional view of three pixels of an organic light emitting diode (OLED) display according to a fourth exemplary embodiment of the invention, and FIG. 12 is a cross-sectional view of three pixels of an organic light emitting diode (OLED) display according to a fifth exemplary embodiment of the invention.

As shown in FIG. 11, in the organic light emitting diode (OLED) display according to the fourth exemplary embodiment, an assistance pixel boundary layer 3733 is formed inside the hole transport layer (HTL) 372.

Also, as shown in FIG. 12, in an organic light emitting diode (OLED) display according to the fifth exemplary embodiment, an assistance pixel boundary layer 3733 is formed between the hole injection layer (HIL) 371 and the hole transport layer (HTL) 372.

As described above, the pixel boundary layer 3731 is formed on the pixel electrode 191 and the assistance pixel boundary layer 3733 is formed inside the hole transport layer (HTL) 372 or between the hole injection layer (HIL) 371 and the hole transport layer (HTL) 372 such that thermal damage to the pixel electrode 191 may be minimized and the interface characteristic of the interface between the pixel electrode 191 and the hole injection layer (HIL) 371 may be improved.

While this disclosure has been described in connection with what is presently considered to be practical exemplary embodiments, it is to be understood that the invention is not limited to the disclosed embodiments but, on the contrary, is intended to cover various modifications and equivalent arrangements included within the spirit and scope of the appended claims.

What is claimed is:

1. An organic light emitting diode (OLED) display, comprising a red pixel, a green pixel, and a blue pixel which are disposed laterally with respect to each other;
the red pixel, the green pixel, and the blue pixel respectively including:
a pixel electrode,
a hole auxiliary layer is disposed on the pixel electrode,
a blue organic emission layer disposed on the hole auxiliary layer,
an electron auxiliary layer disposed on the blue organic emission layer; and
a common electrode disposed on the electron auxiliary layer; and
the red pixel and the green pixel including:
a red boundary layer and a green boundary layer, respectively, disposed on and contacting the hole auxiliary layer,
a red resonance assistance layer and a green resonance assistance layer disposed on and contacting the red boundary layer and the green boundary layer, respectively, to control resonance distances for red light emission and green light emission respectively,
a red organic emission layer formed between the red resonance assistance layer and the blue organic emission layer, and a green organic emission layer formed between the green resonance assistance layer and the blue organic emission layer,
wherein the hole auxiliary layer include a hole injection layer (HIL) disposed on the pixel electrode and a hole transport layer (HTL) disposed on the hole injection layer (HIL), and
wherein the red resonance assistance layer and the green resonance assistance layer are made of the same material as the hole transport layer.

2. The organic light emitting diode (OLED) display of claim 1, wherein the red boundary layer and the green boundary layer include one of NDP-9 (2-(7-dicyanomethylene-1,3,4,5,6,8,9,10-octafluoro-7H-pyrene-2-ylidene)-malononitrile) and HAT-CN (1,4,5,8,9,11-hexaazatriphenylene-hexacarbonitrile).

3. The organic light emitting diode (OLED) display of claim 1, wherein the red boundary layer and the green boundary layer include a material having a melting point in a range of 80 ° C. to 170 ° C.

4. The organic light emitting diode (OLED) display of claim 1, wherein the electron auxiliary layer includes an electron transport layer (ETL) disposed on the blue organic emission layer and an electron injection layer (EIL) disposed on the electron transport layer (ETL).

5. The organic light emitting diode (OLED) display of claim 4, further comprising a reflective layer formed under the pixel electrode.

6. The organic light emitting diode (OLED) display of claim 4, further comprising a pixel boundary layer disposed between the pixel electrode and the hole injection layer (HIL).

7. The organic light emitting diode (OLED) display of claim 6, wherein the pixel boundary layer is formed with a same material as the red boundary layer and the green boundary layer.

8. The organic light emitting diode (OLED) display of claim 6, further comprising an assistance pixel boundary layer formed inside the hole injection layer (HIL).

9. The organic light emitting diode (OLED) display of claim 6, further comprising an assistance pixel boundary layer formed inside the hole transport layer (HTL).

10. The organic light emitting diode (OLED) display of claim 6, further comprising an assistance pixel boundary layer formed between the hole injection layer (HIL) and the hole transport layer (HTL).

* * * * *